United States Patent [19]

Roesler

[11] 4,293,780
[45] Oct. 6, 1981

[54] DIGITAL INTEGRATED SEMICONDUCTOR CIRCUIT

[75] Inventor: Helmut Roesler, Munich, Fed. Rep. of Germany

[73] Assignee: Siemens Aktiengesellschaft, Berlin & Munich, Fed. Rep. of Germany

[21] Appl. No.: 72,975

[22] Filed: Sep. 6, 1979

[30] Foreign Application Priority Data

Oct. 18, 1978 [DE] Fed. Rep. of Germany ....... 2845379

[51] Int. Cl.³ .............................................. H03K 3/02
[52] U.S. Cl. .................................. 307/262; 307/269; 307/480; 328/62
[58] Field of Search ............... 307/208, 210, 215, 262, 307/269; 328/62

[56] References Cited

U.S. PATENT DOCUMENTS

| | | | |
|---|---|---|---|
| 3,989,961 | 11/1976 | Masreliez | 307/262 X |
| 4,090,143 | 5/1978 | Merrell | 307/215 X |
| 4,112,380 | 9/1978 | Thatcher | 307/208 X |
| 4,140,927 | 2/1979 | Feucht | 307/262 |

FOREIGN PATENT DOCUMENTS 2460671 10/1976 Fed. Rep. of Germany.
2713319 9/1978 Fed. Rep. of Germany.

Primary Examiner—Eugene R. La Roche
Attorney, Agent, or Firm—Hill, Van Santen, Steadman, Chiara & Simpson

[57] ABSTRACT

Reset pulses are to be generated independently of a general reset system provided in a digital circuit to be operated by closing a switch and serve for resetting primarily only one portion of the digital system to be driven, so that that portion is reset into the initial digital condition, whereas the remaining portion of the system continues to cycle unfluenced by such reset pulses. In one embodiment a quasi-stationary shift register cell operates to provide the reset pulses in conjunction with an output gate and in another embodiment a modified master-slave flip-flop cell provides the reset pulses, also in conjunction with an output gate.

12 Claims, 3 Drawing Figures

DIGITAL INTEGRATED SEMICONDUCTOR CIRCUIT

BACKGROUND OF THE INVENTION

1. Field of the Invention

The present invention relates to a digital integrated semiconductor circuit having a clock pulse generator supplying two different sequences of clock pulses of the same frequency, in which the two clock pulse sequences supplied by the clock pulse generator have the same operating level and a defined pause is respectively provided between the operating levels of the one clock pulse sequence and the operating levels of the other clock pulse sequence, and more particularly to such an arrangement in which a circuit part is present which can be shifted into the digital initial state by means of a reset pulse and a generator generating the reset pulses is provided, and in which, in addition, a first operating potential, as well as a second operating potential, switched as a reference potential, are provided for the operation of the semiconductor circuit.

2. Description of the Prior Art

A clock pulse generator which is capable of delivering the periodic clock pulses TM and TS of the type mentioned above is described, for example, in the German patent application Ser. No. P 27 13 319.3. In principle, all digital circuit portions which can assume a plurality of stable operating conditions come into consideration as circuit portions which can be shifted into the initial digital condition by means of reset pulses. Counters, shift registers, flip-flop cells and logical gates are of primary concern.

In the known digital integrated semiconductor circuits, the reset pulses are spontaneously generated by means of an appropriate circuit design of the system, for example, in that the system is briefly switched off from the first operating potential $U_{GG}$ and is again connected thereto. Sometimes, however, it is desirable to trigger a resetting of one or more circuit portions in any desired digital condition of such a system without interrupting the operation of the clock pulse generator and further circuit portions, to which end the generation of a reset pulse is necessary, the reset pulse being clearly discriminated from the remaining signals, particularly also from the two clock pulse sequences TM and TS, the reset pulse being generated, as desired, by means of a switch.

SUMMARY OF THE INVENTION

Such a digital integrated semiconductor circuit is provided, according to the present invention, in such a manner that the generator which generates the reset pulses contains an input transistor whose output electrode is connected to the one input of the logic circuit, whose control electrode is charged by means of a sequence of clock pulses generated by the clock pulse generator and whose third terminal is applied to the first electric operating potential by way of a switch. Furthermore, a second input of a logic circuit by the second sequence of the clock pulses generated by the clock pulse generator, as well as a further transistor, are provided by way of which the output electrode of the input transistor can be connected to the reference potential. Finally, a logic gate having negation properties and provided with two inputs and forming the output of the generator is driven at its one input by way of an inverter by means of a signal or, respectively, potential ensuing upon the connection of the first operating potential to the input transistor and is driven at its other input by way of the logic circuit which is charged by the input transistor.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
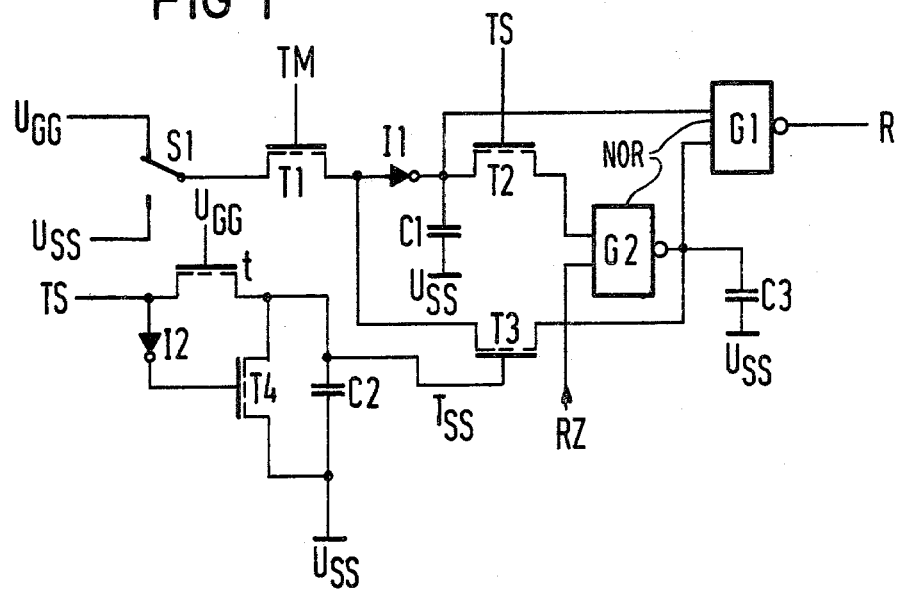
FIG. 1 is a schematic diagram illustrating a first embodiment of the invention.

Referring to FIG. 1, a logic circuit is expanded into a quasi-static shift register cell in that the output of the input transistor is applied, on the one hand, to the input of an inverter and, on the other hand, to a third terminal of a further transistor. Further, the control terminal of the further transistor is charged by means of a subsidiary signal and its output, together with the output of a further gate having negating properties, is applied to the one signal input of the output gate. Moreover, the output of the inverter is connected to an input of the further gate having negating properties by way of a third transistor which is driven by means of the second sequence of clock pulses generated by the clock pulse generator. Finally, the output of the inverter is also connected with the second input of the output gate. In this embodiment, the subsidiary signal are preferably derived from the one sequence of clock pulses TS. A circuit suitable for this purpose is also incorporated in FIG. 1.

The transistors can be bipolar transistors. In this case, the control electrode is provided by the base input, the transistor output is provided by the collector, and the third terminal is provided by the emitter electrode. In the representation illustrated in FIG. 1, however, the more advantageous embodiment in metal-oxide-semiconductor (MOS) technology is selected, whereby the transistors, including the transistors serving for the realization of the logic gates, are provided as transistors of the enhancement type and of the same channel type, although, on the other hand, a realization in capacitance metal-oxide-semiconductor (CMOS) technology is also possible without further ado.

It should also be pointed out that, in addition to the system serving to generate the subsidiary signals, the possibility of also using a coordinator is suggested, which coordinator has the task of providing for the general resetting into the digital initial condition when the entire system is again switched on. The coordinator, for example, can be designed in accordance with German Pat. No. 24 60 671.

In the embodiment of a clock pulse controlled generator serving for generating reset signals illustrated in FIG. 1, a reference potential $U_{SS}$ is connected to an inverter I1 and to an inverter I2, as well as to a pair of logic gates G1 and G2. The same holds true for another operating potential $U_{GG}$. An input transistor T1 has its source connected to a switch S1 which, when closed, connects the operating potential $U_{GG}$ or the operating potential $U_{SS}$ to the source. The drain of the transistor T1 is connected to a branching point which leads, on the one hand, to the input of the inverter I1 and, on the other hand, to the source of a transistor T3. The output of the inverter I1 is connected to the source of a transistor T2 which is connected to an input of the gate G2 which has inverting properties.

In the case when no control by means of a coordinator is provided, the gate G2 is a simple inverter whose output, together with the drain of the transistor T3 is connected to one input of the gate G1 which forms the output of the generator. In case a coordinator is provided, the gate G2 consists of a gate having negating properties and two logic inputs. Preferably, as also illustrated in the exemplary embodiment of FIG. 1, the gate G1 is provided by means of a NOR gate. The same also holds true for the gate G2, if this gate is to be provided with two logic inputs.

Upon realization of the circuit in MOS technology, the inverters I1 and I2 and, if necessary, the gate G2 consists of the series connection of a load resistor (preferably realized by means of an MOS field effect transistor connected as a resistor) connected at the first operating potential $U_{GG}$ and of a driving transistor whose source terminal is connected to the reference potential $U_{SS}$. A circuit point between the resistor and the driving transistor serves as the output of the inverter. The NOR gate G1 (and, if necessary, also the gate G2) consists of the parallel connection of two MOS field effect transistors whose source terminals are charged by the reference potential $U_{SS}$, whereas their drain terminals are connected to the first operating potential $U_{GG}$ by way of a common resistor. The gate of the two transistors constitute respective logic inputs and the connection of the parallel circuit to the common load resistor constitutes the signal output of the gate.

Finally, it should also be pointed out that the output of the inverter I1 is also provided for charging one input of the NOR gate G1. Moreover, the output of the inverter I1 is connected to the reference potential $U_{SS}$ by way of a capacitor C1.

The field effect transistor T2 is supplied at its source by the inverter I1 and is driven by way of its gate with the second sequence TS of the sequences of clock pulses supplied by the clock pulse generator, whereas its drain is connected to the second input of the output NOR gate G1 by way of the gate G2. The drain of the transistor T3, as already mentioned above, is also connected at the same output of the gate G2, the gate of the transistor T3 being driven with the clock pulse signals TSS required for the arrangement described and derived from the clock pulse signal TS.

As mentioned above, in the case where a coordinator is not utilized, the gate G2 functions as an inverter. Otherwise, the gate G2 is a NOR gate which is identical to the output gate G1. The coordinator has the task of emitting a pulse when the system is again switched on, by means of which pulse the digital initial condition of the entire system is produced, so that the circuit is again ready to function. The coordinator described in German Pat. No. 24 60 671 mentioned above comprises a rectification pulse generator in integrated MOS technology which emits a pulse RZ when a supply voltage is switched on and which is characterized in that the source electrode of a first MOS field effect transistor of the enhancement type is connected to a reference potential $U_{SS}$ and the drain electrode is connected to a supply potential $U_{GG}$ by way of the resistor, in that a voltage divider for the supply voltage is connected between the supply potential $U_{GG}$ and the reference potential $U_{SS}$, the gate electrode of the MOS field effect transistor is connected with the dividing point of the voltage divider, and in that the drain electrode of the MOS field effect transistor leads to an output of the circuit arrangement.

Therefore, when such a coordinator is provided, then the gate G2 is also designed as a NOR gate, whereby the second logic input of this gate is driven by means of the pulses supplied by the coordinator, that is the pulses RZ, whereas the other logic input of the gate G2 is charged by way of the drain of the transistor T2. For the rest, the task of the coordinator can also be provided for the present arrangement in that the pulses generated by means of the control of the switch S1 are used in order to switch the arrangement into its initial condition and in that the connection of the arrangement to the operating potentials is of necessity connected with a brief activation of the system generating the reset pulses according to the invention. In this case, the simplified embodiment suffices in which the gate G2 is only an inverter.

The system driven by means of the clock pulses TS for generating the pulses TSS required for the gate of the transistor T3 comprises a field effect transistor t, for example of the depletion type, connected as a resistor and having a source which forms the input of the circuit, a gate which is connected to the operating potential $U_{GG}$, and a drain which is connected to the gate of the transistor T3 to be driven and, moreover, is connected to the reference potential $U_{SS}$ by way of a capacitor C2 and, is also connected by way of the source-drain path of a field effect transistor T4 which is driven by means of the control clock pulse TS via the inverter I2.

Figure 2:
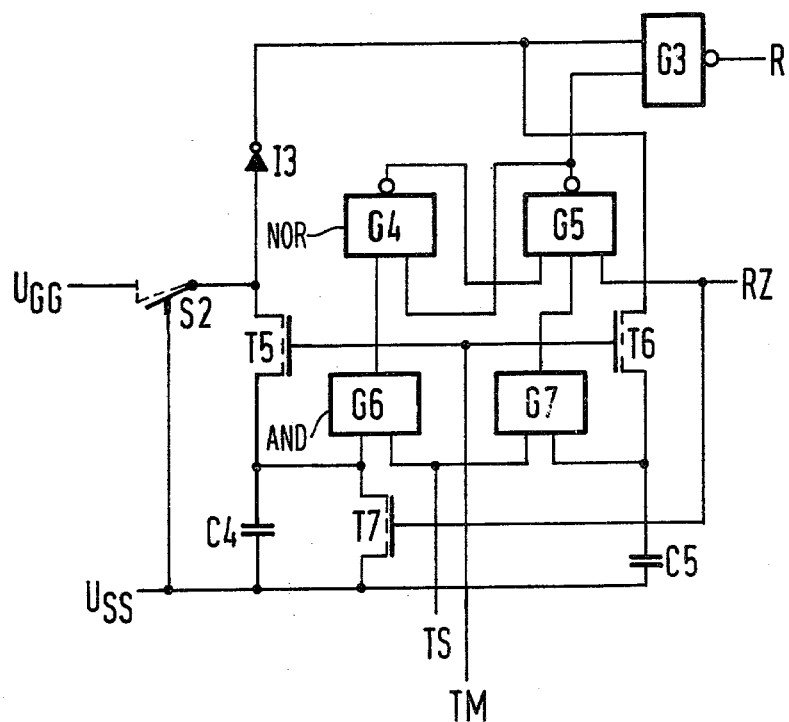
FIG. 2 is a schematic circuit diagram illustrating a second embodiment of the invention.

Before proceeding to the manner of operation of the abovedescribed circuit, the system illustrated in FIG. 2 should also be described in detail. It should first be pointed out that the subsidiary signals TSS are not required in the system illustrated in FIG. 2.

A switch S2 is provided for applying the first operating potential $U_{GG}$ to the drain of a transistor T5 and to the input of an inverter I3 whose output is connected to one signal input of a NOR gate G3 which forms the output of the circuit. The source terminal of a transistor T5 is connected to the reference potential $U_{SS}$ by way of a capacitor C3, on the one hand, and, on the other hand, is connected to the one input of a NOR gate G6 whose second input is charged by the sequence TS of clock pulses. The same sequence of clock pulses, moreover, is applied to the one input of the second NOR gate G7 whose second input is connected to the one terminal of a further field effect transistor T6 and, via a further capacitor C4, to the reference potential $U_{SS}$. The second terminal of the transistor T6, i.e. its drain, is connected with that input of the output gate G3 which is also driven with the output of the inverter I3. The gate electrodes of the two field effect transistors T5 and T6 are driven by means of the clock pulse signal TM supplied by the clock pulse generator.

The output of the NOR gate G6 is connected to one input of a further NOR gate G4, while the output of the NOR gate G7 is connected to the input of a fifth NOR gate G5 which, when provided with a coordinator, has three inputs and, otherwise, has two inputs. In the first case, the one input of the NOR gate G5 is driven by means of the coupling with the output of the NOR gate G4, one input is driven by means of the NOR gate G7 and one input is driven by means of the reset signals RZ supplied by the coordinator. In the second case, only two inputs are required and are driven by means of the gate G7 and by means of the gate G4. The NOR gate G4 has only two inputs of which the one is connected with the output of the gate G5 and the other is connected with the output of the gate G6. The second and third NOR gates of the circuit, i.e. the gates G6 and G7, as already determined, are connected with one of their two logic inputs to the source terminals of the respective transistors T5 and T6, as well as to the reference potential $U_{SS}$ by way of respective capacitors C4 and C5. The other inputs of the gates G6 and G7 are driven by the clock pulse signal TS emitted by the clock pulse generator.

If the NOR gate G5, has three inputs and, accordingly, a coordinator is provided, then the third logic input of the gate G5 driven by the coordinator with the reset pulses RZ is also connected to the gate of the transistor T7 (of the enhancement type), whose source-drain path connects the source of the field effect transistor T5 and, therefore, the one input of the second NOR gate G6 to the reference potential $U_{SS}$ as a function of the reset signal RZ.

Figure 3:
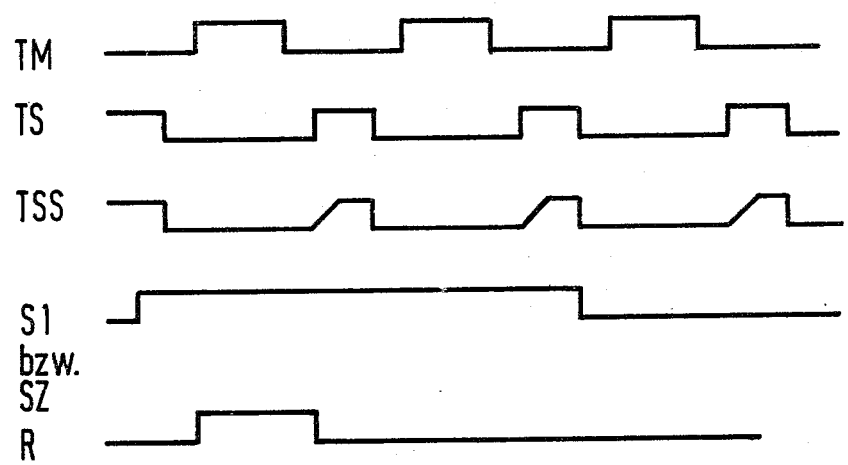
FIG. 3 is a pulse diagram illustrating the temporal course of the reset pulses R with respect to the clock pulse signals TS and TM.

With respect to the operation of the circuit illustrated in FIG. 1, attention is drawn to the pulse diagram of FIG. 3.

When the switch S1 is closed in the position illustrated, the source of the input transistor T1 lies at the potential $U_{GG}$ to which the logic state ONE is assigned. The transistor T1 becomes conductive with the following signal from the clock pulse sequence TM, so that the logic 1 is fed to the input of the inverter I1 and to the source of the transistor T3. The signal appearing at the output of the inverter I1 is stored in the capacitor C1 and, in addition, is applied to the one input of the output NOR gate G1 as well as to the source of the transistor T2 which is scanned or clocked by the second clock pulse signal TS. After the decay of the signal TM applied to the gate of the transistor T1, the transistor T2 becomes conductive as a result of the signal TS now occurring, so that the logic ZERO pending at the output of the inverter I1 is fed to the input of the gate G2 and replaces the ONE that was previously pending there, so that a logic ONE appears at the output of the gate G2. On the other hand, this state, i.e. a ZERO, now existing at the output of the blocked input transistor T1 is transmitted, delayed by means of the formation of the subsidiary signal TSS, by way of the transistor T3 so that this state, i.e. a ZERO, causes the ONE at the output of the logic circuit to be worked off, which is also conditioned by means of the output capacitor C3. In this manner, it is achieved that a logic ZERO respectively pends at the two inputs of the output NOR gate G1 until it extends from the leading edge of the first clock pulse TM appearing after actuation of the switch S1 up to the leading edge of the next successive clock pulse TS.

A circuit according to FIG. 2, whose core is a master-slave flip-flop constructed of four NOR gates (or also NAND gates) G4–G7 operates similar to the circuit arrangement illustrated in FIG. 1. Upon occurrence of the first clock pulse TM after the closing of the switch S2 to the position illustrated, the capacitor C4 is charged to a ONE by way of the input transistor T5, whereas the signal appearing upon the closing of the switch S2 at the input of the inverter I3 results in a logic ZERO at the output of the inverter and, therefore, at the one input of the output gate G3. The gate G3, however, can only generate a reset pulse R when a ZERO is also applied to the other input, i.e. at the output of the NOR gate G5. This ZERO appears as soon as the two transistors T5 and T6 become conductive because of the following signal TM and, accordingly, the logic ONE conditioned by means of the first operating potential $U_{GG}$ is fed to the NOR gate G6 by way of the transfer transistor T5 (the input transistor). The signal TS now following causes a logic ONE to appear at the output of the gate G5, so that the reset pulse R appearing at the output of the gate G3 is terminated.

The general reset pulses RZ supplied by way of a coordinator which may be provided are supplied to the NOR gate G5 in the system illustrated in FIG. 2, the NOR gate G5 then being provided with three logic inputs for this purpose. Moreover, in this case, an additional field effect transistor T7 is provided whose source is connected to the reference potential $U_{SS}$, whose drain is connected to the output of the input transistor T5 and whose gate is connected with the coordinator supplying the signals RZ. The coordinator is not illustrated on the drawings but has been fully described above.

The function of the signal RZ in the arrangements according to FIGS. 1 and 2 is such that a logic ZERO is generated by means of this signal at the two inputs of the output gate G1 or, respectively G3, so that a reset pulse R is emitted.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a digital integrated semiconductor circuit arrangement of the type having a clock pulse generator for supplying a first sequence of first clock pulses, a second sequence of second clock pulses and a third sequence of third pulses in phase with said second pulses, the sequences having the same frequency with the leading edge of each second pulse time-spaced from the trailing edge of the previous first pulse, and a circuit to be operated into a predetermined digital condition, the improvement therein comprising:

a control pulse generator connected to the circuit to be operated for producing a control pulse to operate that circuit into the predetermined condition, said control pulse generator including
an input transistor circuit including a first transistor having a controlled conduction path with input and output electrodes and a control electrode, a first logic circuit including first and second inputs and an output,
an inverting second logic circuit including a first input a second input and an output which serves to provide said control pulse,
said first inputs of said logic circuits connected to said output electrode of said first transistor circuit,
a switch connected to apply a first potential to said input electrode, said control electrode connected to receive a first pulse to clock said input transistor circuit to apply a first logic signal pulse to said first inputs of said logic circuits, said output of said first logic circuit connected to said second input of said second logic circuit, said second input of said second logic circuit connected to receive the second pulse which follows the mentioned first pulse to clock said first logic circuit to provide a second logic signal pulse to said second logic circuit, said second logic circuit responsive to produce said control pulse defined by the leading edges of said first and second logic signal pulses, and a second transistor circuit including a second transistor having a controlled conduction path connected between said output electrode of said first transistor and a second potential and a control electrode connected to receive and operable in response to a third pulse to connect said first transistor to said second potential.

2. The improved circuit arrangement of claim 1, wherein: said input circuit comprises an inverter which includes said output electrode.

3. The improved circuit arrangement of claim 2, wherein said first logic circuit includes an inverting gate connected to said inverter, a third transistor circuit including a transistor including a controlled conduction path connected between said inverter and said inverting gate and having a gate electrode connected to receive said second pulse, a capacitor connected to said inverter for storing the first logic signal pulse, and a third transistor having a controlled conduction path connected between said output of said first transistor circuit and said second input of said second logic circuit and a control electrode connected to receive a third pulse.

4. The improved circuit arrangement of claim 3, wherein said second logic circuit comprises a NOR gate.

5. The improved circuit arrangement of claim 4, comprising:

a reset coordinator connected to receive and responsive to an operating voltage to provide a reset pulse said coordinator connected to said first logic circuit.

6. The improved circuit arrangement of claim 5, wherein:

said first logic circuit includes a NOR gate.

7. The improved circuit arrangement of claim 6, comprising:

a capacitor, a second inverter, a fourth transistor having a controlled conduction path with first and second electrodes and a control electrode, said control electrode connected to the first operating voltage, said first electrode and said second inverter connected to receive said second pulse, said third electrode connected to the second potential via said capacitor, and a fifth transistor including a controlled conduction path connected across said capacitor and a control electrode connected to said second inverter, said fifth transistor operated in response to a second pulse to drive said third transistor to connect said output terminal of said first transistor to said second input of said second logic circuit.

8. The improved circuit arrangement of claim 7, wherein:

said transistors are metal-oxide-semiconductor field effect transistors.

9. The improved circuit arrangement of claim 7, wherein:

said transistors are metal-oxide-semiconductor enhancement type field effect transistors.

10. The improved circuit arrangement of claim 1, wherein:

said first logic circuit comprises first, second, third and fourth NOR gates connected as a master-slave flip-flop, and said transistors are metal-oxide semiconductor enhancement type field effect transistors.

11. In a digital integrated semiconductor circuit arrangement of the type having a clock pulse generator for supplying a first sequence of first clock pulses, a second sequence of second clock pulses and a third sequence of third pulses in phase with said second pulses, the sequences having the same frequency with the leading edge of each second pulse time-spaced from the trailing edge of the previous first pulse, and a circuit to be operated into a predetermined digital condition, the improvement therein comprising:

a control pulse generator connected to the circuit to be operated for producing a control pulse to operate that circuit into the predetermined condition, said control pulse generator including first, second, third, fourth and fifth NOR gates each including first and second inputs and an output, with the output of said fifth NOR gate constituting the control pulse generator output, said first, second, third and fourth NOR gates connected as a master-slave flip-flop having a first input, a second input, a clock input connected to receive the second pulses, and an output, first and second field effect transistors each having a source, a drain and a gate, a first capacitor connecting said source of said first transistor to a first potential, a second capacitor connecting said source of said second transistor to the first potential, an inverter connected between said drain of said first transistor and said first input of said fifth NOR gate in common with said drain of said second transistor, said gates connected together to receive said first pulses as clock pulses, and a switch connected to said drain of said first transistor and operable to apply a second potential to said drain, said output of said flip-flop connected to drive said second input of said fifth NOR gate, whereby, upon the application of said second potential to said drain of said first transistor to define the leading edge of a control pulse via said inverter and said fifth NOR gate, said transistors are clocked by a first pulse to drive said flip-flop and said flip-flop is clocked by a second pulse to drive said fifth NOR gate to define the trailing edge of the control pulse.

12. The improved circuit arrangement of claim 11, comprising:

a third field effect transistor including a source-emitter path connected between the source of said first transistor and the first potential, and a gate connected to receive a reset pulse.

* * * * *